United States Patent
Galbraith et al.

(10) Patent No.: US 11,677,420 B1
(45) Date of Patent: Jun. 13, 2023

(54) EXTERNALIZING INTER-SYMBOL INTERFERENCE DATA IN A DATA CHANNEL

(71) Applicant: Western Digital Technologies, Inc., San Jose, CA (US)

(72) Inventors: Richard Galbraith, Rochester, MN (US); Jonas Goode, Lake Forest, CA (US); Iouri Oboukhov, Rochester, MN (US); Niranjay Ravindran, Rochester, MN (US)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 17/683,958

(22) Filed: Mar. 1, 2022

(51) Int. Cl.
*H03M 13/11* (2006.01)
*H03M 13/09* (2006.01)

(52) U.S. Cl.
CPC ..... *H03M 13/1125* (2013.01); *H03M 13/098* (2013.01); *H03M 13/1114* (2013.01); *H03M 13/1128* (2013.01)

(58) Field of Classification Search
CPC combination set(s) only.
See application file for complete search history.

(56) References Cited

U.S. PATENT DOCUMENTS

| | | | | |
|---|---|---|---|---|
| 5,263,033 A * | 11/1993 | Seshadri | ............ | H03M 13/41 714/787 |
| 5,742,642 A * | 4/1998 | Fertner | ............ | H04L 25/03057 375/348 |
| 5,887,035 A * | 3/1999 | Molnar | ............ | H04L 25/03331 375/340 |
| 6,484,285 B1 * | 11/2002 | Dent | ............ | H03M 13/39 714/791 |
| 7,848,465 B2 | 12/2010 | Bliss et al. | | |
| 8,484,531 B1 | 7/2013 | Varnica et al. | | |
| 2005/0138520 A1 * | 6/2005 | Richardson | ....... | H03M 13/3723 714/755 |
| 2007/0288833 A1 * | 12/2007 | Djurdjevic | ....... | G11B 20/10009 714/784 |
| 2012/0155239 A1 | 6/2012 | Nishida et al. | | |
| 2013/0073922 A1 | 3/2013 | Varnica et al. | | |

(Continued)

OTHER PUBLICATIONS

Duric et al., "Low-Density Parity-Check Codes Over Partial Response Magnetic Recording Channels," Proc. XLVII ETRAN Conference, Herceg Novi, Jun. 8-13, 2003, vol. II, pp. 94-98.

(Continued)

*Primary Examiner* — Steve N Nguyen
(74) *Attorney, Agent, or Firm* — Patent Law Work LLP

(57) ABSTRACT

Example systems, read channel circuits, data storage devices, and methods to use inter-symbol interference message passing (ISI-MP) data in a read channel are described. The read channel circuit includes a soft output detector, such as a soft output Viterbi algorithm (SOVA) detector, configured to determine both the first most likely and second most likely sets of symbols and output inter-symbol interference data based on the adjacent symbols and corresponding ISI in each set of symbols. The inter-symbol interference data may be used by an ISI-MP circuit configured to model ISI-MP and provide feedback to an iterative decoder during local iterations.

20 Claims, 7 Drawing Sheets

(56) References Cited

U.S. PATENT DOCUMENTS

2018/0019905 A1* 1/2018 Zhu ................... H04L 27/2698

OTHER PUBLICATIONS

Galbraith et al., "Iterative Detection Read Channel Technology in Hard Disk Drives," HGST, a Western Digital company, whitepaper, Nov. 2008, 8 pgs.

Galbraith et al., "Architecture and Implementation of a First-Generation Iterative Detection Read Channel," IEEE Transactions on Magnetics, vol. 46, No. 3, Mar. 2010, pp. 837-843.

Jeong et al., "Iterative decoding of SOVA and LDPC product code for bit-patterned media recoding," 62nd Annual Conference on Magnetism and Magnetic Materials, Pittsburgh, Pennsylvania, Nov. 2017, 7 pgs.

Mittelholzer et al., "Reduced-Complexity Decoding of Low Density Parity Check Codes for Generalized Partial Response Channels," IEEE Transactions on Magnetics, vol. 37, No. 2, Mar. 2001, pp. 721-728.

\* cited by examiner

EXTERNALIZING INTER-SYMBOL INTERFERENCE DATA IN A DATA CHANNEL

TECHNICAL FIELD

The present disclosure relates to data channels for data storage devices, such as hard disk drives. In particular, the present disclosure relates to iterative decoding in a read channel using additional error event information from a sequence detector.

BACKGROUND

In present-day data transmission and storage mediums, such as disk, tape, optical, mechanical, and solid-state storage drives, data detection is based in large part on techniques developed in the early years of the data storage industry. While recently developed read channels invoke relatively new data encoding and detection schemes such as iterative detection and low-density parity codes (LDPC), much of the signal processing power in today's read channels is still based on partial-response maximum-likely-hood detection (PRML), developed in the early 1990's. Iterative LDPC code detectors use successive iterations and calculated reliability values to arrive at the most likely value for each bit. Soft information may be calculated for each bit in a multi-bit symbol and is sometimes represented by log likelihood ratio (LLR) values, which are the natural logarithm of the ratio of the probability that the bit is a 1 divided by the probability that the bit is a 0. For example, the soft information for a symbol may be represented by a vector of cost values that have $2^n$ (or, in some configurations $2^n-1$), where n is the symbol size (number of bits). Each cost value may describe the relative costs or difference of costs for the bit or symbol values and be formatted as a soft LLR vector. Each cost value in the vector relates to the context of the symbol, not a specific bit value within the symbol. In some configurations, a soft output Viterbi algorithm (SOVA) detector that determines LLR values for each bit may be paired with an iterative decoder for determining bias values for the next iteration of the SOVA. For example, a SOVA detector may be paired with an LDPC decoder that receives bit LLR values, returns extrinsic LLR values, and outputs hard decisions when LDPC constraints are met.

The SOVA detectors may be based on maximum-likelihood sequence detection for a given symbol and are subject to errors (incorrect bit decisions) caused by noise in the read channel and other sources. These error events may be characterized as a pattern of one or more bits going into error due to incorrect sequence selection by the SOVA detector. Bits or symbols involved in competing sequences are coupled to each other by inter-symbol interference (ISI). The transfer function of soft input to soft output through the SOVA detector may be considered ISI message passing (ISI-MP) and assists the LDPC iterative decoding. However, due to the processing cost of iterations through the SOVA detector, not every LDPC iteration may be supported by a SOVA iteration. For example, local LDPC iterations based on parity message passing may occur 4-10 times for each global iteration through the SOVA detector for ISI message passing.

There is a need for technology that improves the performance and/or error rates of iterative read channels without every LDPC iteration relying on the SOVA detector for ISI message passing.

SUMMARY

Various aspects for error event handling using ISI message passing in a read channel are disclosed, particularly use of error event bubble data from the SOVA detector to improve read performance.

One general aspect includes a read channel circuit that includes a soft output detector configured to: receive an input signal, determine a first set of symbols with a first likelihood within a period of the input signal, determine a second set of symbols with a second likelihood within the period of the input signal, determine first inter-symbol interference data for adjacent symbols in the first set of symbols, determine second inter-symbol interference data for adjacent symbols in the second set of symbols, output soft information for the first set of symbols, and output the first inter-symbol interference data and the second inter-symbol interference data.

Implementations may include one or more of the following features. The read channel circuit may include an inter-symbol interference message passing model configured to: receive the first inter-symbol interference data and the second inter-symbol interference data from the soft output detector; and determine a change in the soft information for the first set of symbols based on the first inter-symbol interference data, the second inter-symbol interference data, and at least one error event; and output the change in the soft information for the first set of symbols. The read channel circuit may include an iterative decoder configured to: receive the soft information for the first set of symbols; determine output data bits based on the soft information for the first set of symbols, parity encoding, and parity message passing; iteratively process the soft information for the first set of symbols until a parity constraint of the parity encoding is met; selectively output the output data bits; selectively return extrinsic soft information for the first set of symbols to the soft output detector for global iterations; and selectively send the extrinsic soft information for the first set of symbols to the inter-symbol interference message passing model for local iterations. The inter-symbol interference message passing model may be further configured to receive the extrinsic soft information for the first set of symbols for local iterations; determining the change in the soft information for the first set of symbols may be further based on the extrinsic soft information indicating the at least one error event; and outputting the change in the soft information of the first set of symbols may modify the soft information of the first set of symbols as an input for a next local iteration of the iterative decoder. The first inter-symbol interference data and the second inter-symbol interference data may include at least one error event bubble; the at least one error event bubble may have a length corresponding to a number of adjacent symbols in a trellis of the soft output detector; error events with a length greater than one symbol may generate inter-symbol interference; and the first inter-symbol interference data and the second inter-symbol interference data may describe inter-symbol interference between adjacent symbols in the at least one error event bubble. The soft output detector may be further configured to: determine a first minimal element cost per symbol index for the first set of symbols; determine a second minimal element cost per symbol index for the second set of symbols; and check reciprocity between adjacent states to determine adjacent symbols belonging to a same error event bubble. The first inter-symbol interference data and the second inter-symbol interference data may include: a series of matrices corresponding to connections between adjacent symbols in the trellis of the soft output detector; a first indicator in at least one matrix of the series of matrices corresponding to inter-symbol interference between adjacent symbols in the first set of symbols; and a second indicator in the at least one matrix of the series of matrices corresponding to inter-symbol interference between adjacent symbols in the second set of symbols. The first indicator and the second indicator may be included in a plurality of sequential matrices in the plurality of matrices for error event bubbles with a length greater than two. The soft output detector may be further configured to: determine a third set of symbols with a third likelihood within the period of the input signal; determine third inter-symbol interference data for adjacent symbols in the third set of symbols; and output the third inter-symbol interference data. A data storage device may include the read channel circuit.

Another general aspect includes a method that includes: receiving, by a soft output detector, an input signal; determining, by the soft output detector, a first set of symbols with a first likelihood within a period of the input signal; determining, by the soft output detector, a second set of symbols with a second likelihood within the period of the input signal; determining first inter-symbol interference data for adjacent symbols in the first set of symbols; determining second inter-symbol interference data for adjacent symbols in the second set of symbols; outputting soft information for the first set of symbols; and outputting the first inter-symbol interference data and the second inter-symbol interference data.

Implementations may include one or more of the following features. The method may include: receiving, by an inter-symbol interference message passing circuit, the first inter-symbol interference data and the second inter-symbol interference data from the soft output detector; determining a change in the soft information for the first set of symbols based on the first inter-symbol interference data, the second inter-symbol interference data, and at least one error event; and outputting, by the inter-symbol interference message passing circuit, the change in the soft information for the first set of symbols. The method may include: receiving, by an iterative decoder, the soft information for the first set of symbols; determining, by the iterative decoder, output data bits based on the soft information for the first set of symbols, parity encoding, and parity message passing; iteratively processing, by the iterative decoder, the soft information for the first set of symbols until a parity constraint of the parity encoding is met; selectively outputting, by the iterative decoder, the output data bits; selectively returning, by the iterative decoder, extrinsic soft information for the first set of symbols to the soft output detector for global iterations; and selectively sending, by the iterative decoder, the extrinsic soft information for the first set of symbols to the inter-symbol interference message passing circuit for local iterations. The inter-symbol interference message passing circuit may be further configured to receive the extrinsic soft information for the first set of symbols for local iterations; determining the change in the soft information for the first set of symbols may be further based on the extrinsic soft information indicating the at least one error event; and outputting the change in the soft information of the first set of symbols may modify the soft information of the first set of symbols as an input for a next local iteration of the iterative decoder. The first inter-symbol interference data and the second inter-symbol interference data may include at least one error event bubble; the at least one error event bubble may have a length corresponding to a number of adjacent symbols in a trellis of the soft output detector; error events with a length greater than one symbol may generate inter-symbol interference; and the first inter-symbol interference data and the second inter-symbol interference data may describe inter-symbol interference between adjacent symbols in the at least one error event bubble. The method may include: determining a first minimal element cost per symbol index for the first set of symbols; determining a second minimal element cost per symbol index for the second set of symbols; and checking reciprocity between adjacent states to determine adjacent symbols belonging to a same error event bubble. The first inter-symbol interference data and the second inter-symbol interference data may include: a series of matrices corresponding to connections between adjacent symbols in the trellis of the soft output detector; a first indicator in at least one matrix of the series of matrices corresponding to inter-symbol interference between adjacent symbols in the first set of symbols; and a second indicator in the at least one matrix of the series of matrices corresponding to inter-symbol interference between adjacent symbols in the second set of symbols. The first indicator and the second indicator may be included in a plurality of sequential matrices in the plurality of matrices for error events with a length greater than two. The method may include: determining, by the soft output detector, a third set of symbols with a third likelihood within the period of the input signal; and determining third inter-symbol interference data for adjacent symbols in the third set of symbols; and outputting the third inter-symbol interference data.

Still another general aspect may include means for detecting symbols within an input signal configured to: determine a first set of symbols with a first likelihood within a period of the input signal, determine a second set of symbols with a second likelihood within the period of the input signal, determine first inter-symbol interference data for adjacent symbols in the first set of symbols, determine second inter-symbol interference data for adjacent symbols in the second set of symbols, output soft information for the first set of symbols, and output the first inter-symbol interference data and the second inter-symbol interference data. The system also includes means for modeling inter-symbol interference message passing configured to: receive the first inter-symbol interference data and the second inter-symbol interference data, and determine a change in the soft information for the first set of symbols based on the first inter-symbol interference data, the second inter-symbol interference data, and at least one error event; and output the change in the soft information for the first set of symbols.

The present disclosure describes various aspects of innovative technology capable of improving processing efficiency and/or error rates in data storage devices. The various embodiments include operations and control circuitry to overcome or at least reduce issues previously encountered in data storage devices and, accordingly, are more reliable and/or may support higher areal densities and/or data rates than other data storage devices. That is, the various embodiments disclosed herein include hardware and/or software with functionality to improve read operation processing and read channel performance, such as by using error event bubble data from a soft output detector to determine soft information for iterations of an iterative decoder. Accordingly, the embodiments disclosed herein provide various improvements to read channel circuits, data storage devices, and computing systems incorporating such read channels.

BRIEF DESCRIPTION OF THE DRAWINGS

The techniques introduced herein are illustrated by way of example, and not by way of limitation, in the figures of the accompanying drawings in which like reference numerals are used to refer to similar elements.

DETAILED DESCRIPTION

Novel data processing technology, such as but not limited to systems, data storage devices, read channels, and methods for detecting, decoding, and/or recovering previously encoded data in a data channel, such as a data storage read channel using an inter-symbol interference message passing data from a soft information detector (e.g., a soft output Viterbi algorithm (SOVA) detector), are disclosed. While this technology is described below in the context of a particular system architecture in various cases, it should be understood that the systems and methods can be applied to other architectures and organizations of hardware.

In some examples, the data channel technology may be applied to a data storage read channel for recovering encoded data from a non-volatile storage medium. For example, the read channel may be incorporated in a data storage device, such as a hard disk drive (HDD), a solid-state drive (SSD), a flash drive, an optical drive, a tape drive, etc. It is to be understood that the embodiments discussed herein may be applicable HDD and SSD, as well as a tape drive such as a tape embedded drive (TED) or an insertable tape media drive, such as those conforming to the LTO (Linear Tape Open) standards. An example TED is described in U.S. Pat. No. 10,991,390, issued Apr. 27, 2021, titled "Tape Embedded Drive," and assigned to the same assignee of this application, which is herein incorporated by reference. As such, any reference in the detailed description to an HDD or tape drive is merely for exemplification purposes and is not intended to limit the disclosure unless explicitly claimed. For example, references to disk media in an HDD embodiment are provided as examples only, and can be substituted with tape media in a tape drive embodiment. Furthermore, reference to or claims directed to magnetic recording devices or data storage devices are intended to include at least both HDD and tape drive unless HDD or tape drive devices are explicitly claimed.

Figure 1A:
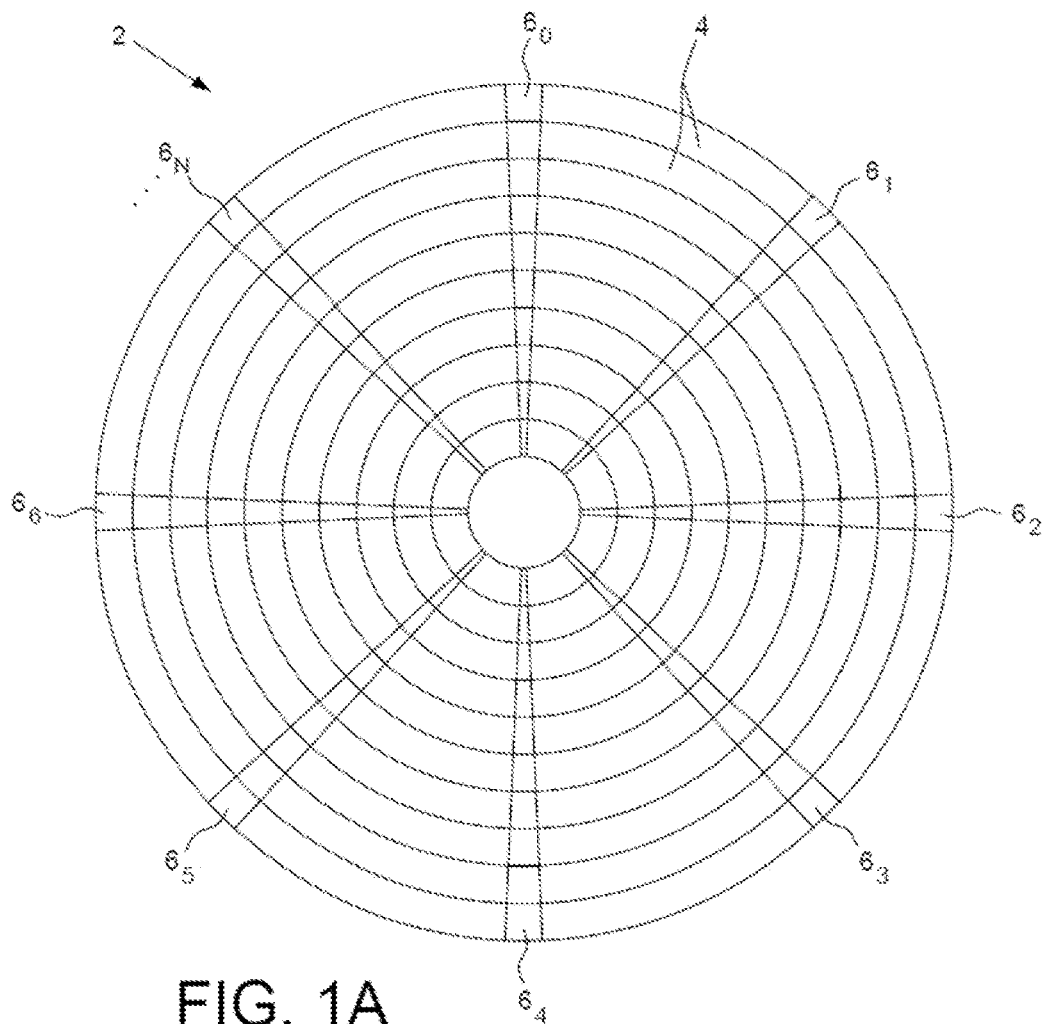
FIG. 1A is a block diagram of a prior art disk format comprising a plurality of servo tracks defined by servo sectors.
Figure 1B:
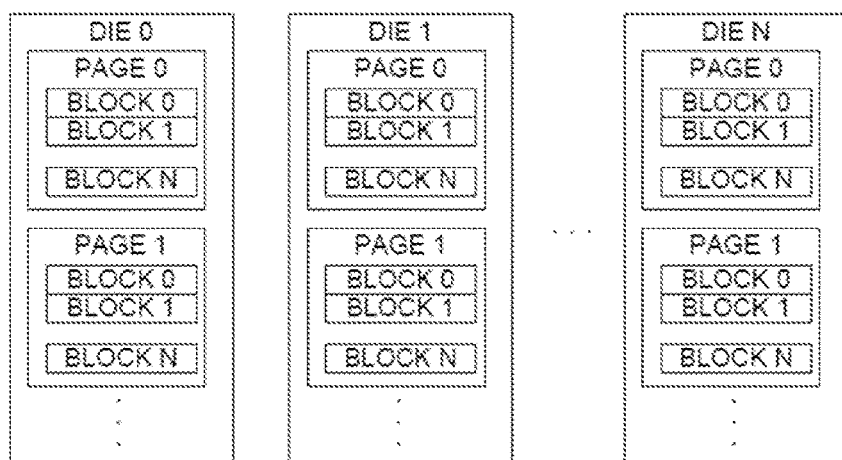
FIG. 1B is a block diagram of a prior art solid state drive format comprising a plurality of dies each comprising a plurality of pages.

FIG. 1A shows a prior art disk format 2 as comprising a number of servo tracks 4 defined by servo sectors $6_0$-$6_N$ recorded around the circumference of each servo track. Data tracks are defined relative to the servo tracks at the same or different radial density, wherein each data track comprises a plurality of data sectors. Each data sector may store the data symbols of a single codeword, or in other examples, each data sector may store symbols from multiple codewords (i.e., interleaved codewords). FIG. 1B shows a prior art die format for a solid state drive, wherein each die may store multiple pages and each page may store multiple blocks each corresponding to a data sector or other data unit of encoded binary data of a disk drive.

In data storage devices incorporating non-volatile storage media, such as the disk of FIG. 1A, the non-volatile memory devices of FIG. 1B, or magnetic tape in a TED or other tape drive such as LTO, an analog read signal from the storage media may be converted into a digital bit stream by an analog-to-digital-converter (ADC) and passed to the read channel for further processing. In some examples, bit data values may be stored to a non-volatile storage medium as data blocks or other data units using one or more encoding schemes. These bit data values may be processed from the digital bit stream in windows of multiple adjacent bits and a set of adjacent bits, such as 2, 3, 5, 7, or more continuous bits from the bit stream, may be processed as a symbol for data detection and/or decoding purposes. One or more symbols may, in turn, make up one or more codewords, such as codewords selected and encoded in accordance with an error detection and/or correction scheme, such as low-density parity check (LDPC) codes. These encoded codewords may be decoded to determine decoded bit values. In some examples, the decoded bit values from these codewords may still be subject to further decoding, such as run-length limited (RLL) decoding and/or descrambling to arrive that the output data. While the description below refers to non-volatile storage medium/media (NVSM) examples, the various examples disclosed could be applied to process data read from volatile medium/media as well, as well as data signals transmitted through and/or received from a wired, wireless, or other transmission medium.

Read channels may use soft output detectors, such as SOVA detectors, that provide a maximum likelihood sequence detector for a moving window of symbols, as opposed to direct bit detection. These soft output detectors may be configured to output soft information corresponding to the likelihood that a symbol of a symbol size n (number of bits) has a detected value (e.g., pattern of 0s and/or 1s). For example, a soft output detector may output an array of cost values corresponding to log likelihood ratio (LLR) values for the symbol. As described above, the LLR vector may describe the relative costs or difference of costs for the bit or symbol values, where each cost value in the vector relates to the context of the symbol, not a specific bit value within the symbol. The LLR vector may indicate the maximum likelihood (most likely) symbol value for the symbol, based on the contextual soft information. The most likely symbol pattern determined by the maximum likelihood sequence detection may generate errors. Errors may be characterized by error events where a pattern of multiple bits go into error due to the maximum likelihood set of bit values not matching the actual encoded values. These errors may be detected using LDPC codes and a combination of iterations within the LDPC decoder (local iterations) and back through the soft output detector (global iterations) may correct detected errors by exchange extrinsic information between the respective detector and decoder. The transfer function of the soft input to the soft output of the soft information detector may be considered inter-symbol interference (ISI) message passing (ISI-MP). ISI-MP may occur inside the trellis operations of the soft information detector and, while very helpful to iterative decoding, may not be available to the LDPC decoder itself, which merely relies on updated soft information from the soft information detector for each global iteration.

Within read channels, iterations through the soft information detector are relatively expensive in terms of time and processing resources. It may not be practical to pass through the soft information detector on every iteration of the decoder. As such, read channels may be configured to use fewer global iterations than local iterations when processing an input signal. For example, read channels may be configured to use 4-10 times more local iterations than global iterations. The LDPC decoder may go through 4-10 decoding iterations for every single iteration back through the soft information detector. As a result, each LDPC decoder iteration may rely on parity message passing within local iterations, but not have the benefit of the ISI-MP and corresponding ISI data that would assist in more efficiently determining the decoded bit data.

Figure 2:
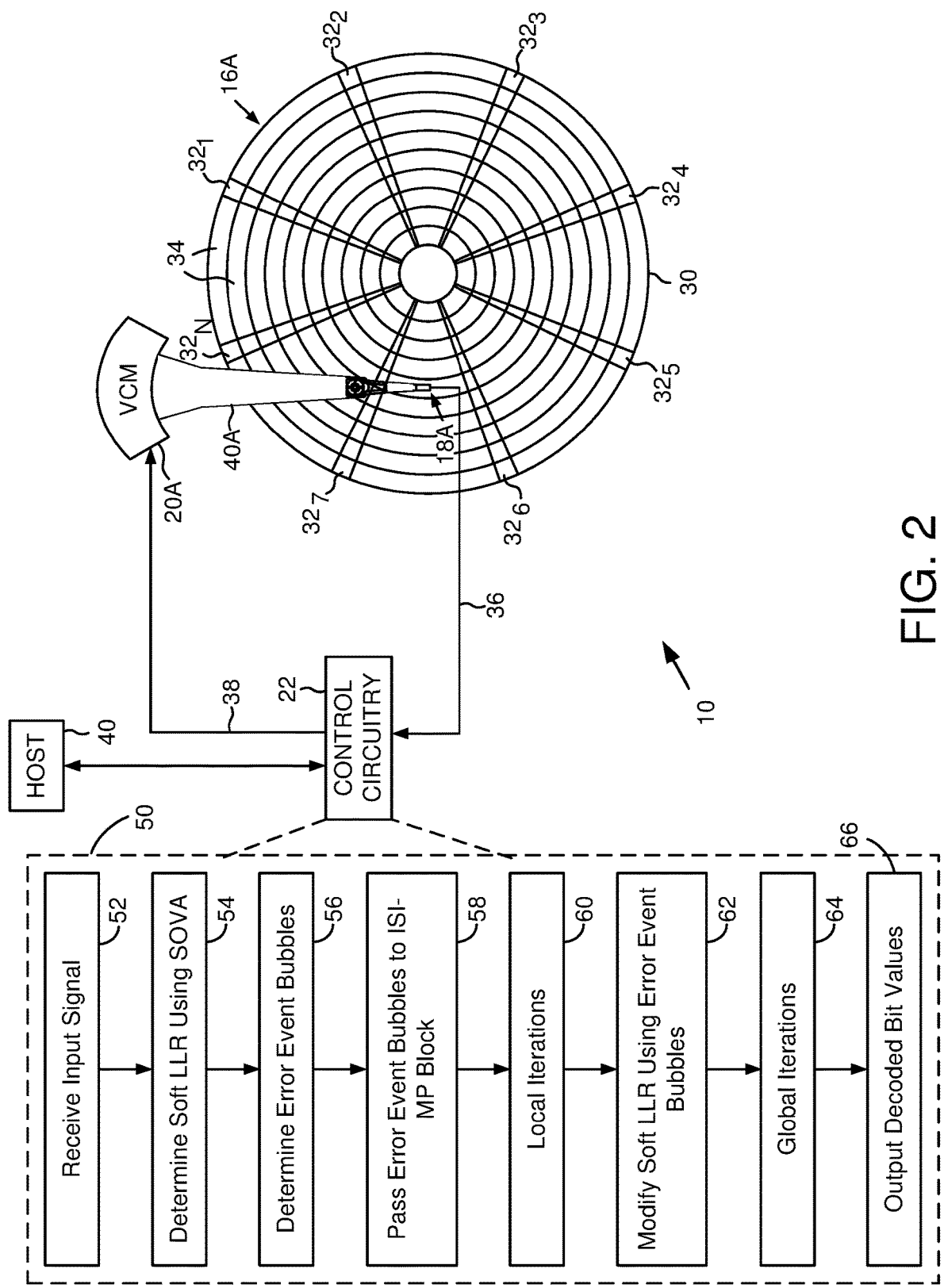
FIG. 2 is a diagram of an example data storage device in the form of a disk drive comprising a head actuated over a disk surface and related read channel control circuitry.

FIG. 2 shows a data storage device in the form of a disk drive according to an embodiment comprising a disk 30 having at least one disk surface 16A and at least one head 18A actuated over disk surface 16A by a first actuator 20A. While a single disk, head, and actuator are shown, multiple disks, heads, and/or actuators may be present in other configurations.

Disk drive 10 further comprises control circuitry 22 configured to execute flow diagram 50 for using ISI data during iterative decoding in a read channel. More specifically, the SOVA detector may determine error event bubbles and pass corresponding ISI data to an ISI-MP block in an iterative decoder loop that models ISI message passing for local iterations of the iterative decoder. Disk drive 10 may include on-board electronics comprising one or more systems on a chip (SOC), application-specific integrated circuits (ASICs), and/or other data or signal processing components attached to a printed circuit board assembly (PCBA) and/or other interconnects (such as the flex connector to the actuators). Control circuitry 22 may include circuits, processors, memory devices, and software or firmware executed therein for completing various data and signal processing tasks, including control of actuator 20A and read-write operations through head 18A. In some embodiments, control circuitry 22 may include distinct servo control and read/write channel paths for each actuator and their respective disk surfaces (and data written thereon).

In FIG. 2, each disk surface (e.g., 16A) comprises a plurality of servo sectors $32_1$-$32_N$ that define a plurality of servo tracks 34, wherein data tracks are defined relative to the servo tracks at the same or different radial density. Control circuitry 22 processes a read signal 36 emanating from the head to demodulate the servo sectors and generate a position error signal (PES) representing an error between the actual position of the head and a target position relative to a target track. A servo control system in control circuitry 22 filters the PES using a suitable compensation filter to generate a control signal 38 applied to a coarse actuator (e.g., voice coil motor (VCM) actuator 20A) which rotates an actuator arm (e.g., 40A) about a pivot in order to actuate the corresponding heads radially over the disk surfaces in a direction that reduces the PES. The heads may also be servoed using a fine actuator, such as a piezoelectric (PZT) actuator, configured to actuate a suspension relative to the actuator arm, and/or configured to actuate the head relative to the suspension. Servo sectors $32_1$-$32_N$ may comprise any suitable head position information, such as a track address for coarse positioning and servo bursts for fine positioning. The servo bursts may comprise any suitable pattern, such as an amplitude-based servo pattern or a phase-based servo pattern.

A host 40 is a computer system or other external system or device to which disk drive 10 is coupled and/or integrated. The storage medium (e.g., disk 30) is accessible for data storage and I/O (input/output) operations. For instance, host 40 may issue commands for data manipulation in the storage medium. Control circuitry 22 mediates the communication between host 40 and the storage medium and provides an interface between the storage medium and a bus connecting it to the rest of the system. For example, control circuitry 22 may be a drive or memory controller of a data storage device that receives host storage commands and returns responses, including host data written to and read from disk 30. Control circuitry 22 may include data write channel circuitry for data writing execution and data read channel circuitry for data reading execution.

When reading data from disk 30, control circuitry 22 may receive a command signal from host 40, which instructs control circuitry 22 to access a certain portion of disk 10 (e.g., the locations of blocks on disk surface 16A corresponding to a data unit) to be accessed. As a further example, in response to the command signal, servo electronics within the control circuitry 22 may produce control signals that position head 18A over a desired track (e.g., tracks 34) in disk drive 10, which develops read signal 36 indicative of flux reversals in the track over which head 18A is positioned. Control circuitry 22 may include a read channel configured to detect and decode host data from read signal 36. Control circuitry 22 may then manipulate and/or return the host data to host 40.

Control circuitry 22 may include hardware and firmware configured to execute an example method for using ISI data in the read channel, such as flow diagram 50. In some embodiments. control circuitry 22 may incorporate hardware and/or software elements similar to those shown and described for FIG. 3 below for executing flow diagram 50. For example, control circuitry 22 may incorporate a SOVA detector coupled to an LDPC processor that includes an ISI-MP block incorporating an ISI-MP model for modifying soft information based on ISI data from the SOVA detector and extrinsic information from matrix processing by the LDPC processor. The resulting iterative decoding may improve the reliability and efficiency of the read channel for correctly detecting and decoding host data stored to disk 30.

At block 52, an input signal may be received. For example, read signal 36 may be processed through an analog front-end, including an analog-digital converter (ADC), and an equalizer to provide an input signal to a SOVA detector.

At block 54, soft information, such as soft LLR values corresponding to each symbol in a series of symbols, may be determined. For example, the SOVA detector may apply a Viterbi algorithm to detect the most likely bit states in each symbol (symbol pattern) based on a corresponding set of bit positions in the input signal.

At block 56, error event bubbles may be determined based on a comparison of the first most likely symbol values and the second most likely symbol values. For example, the SOVA detector may determine the most likely symbol values and one or more alternate symbol values, such as second most likely symbol values, and determine the differences between the sets of likely symbol values to identify series of adjacent symbols that correspond to a potential error event with inter-symbol interference between two or more symbols. Error event bubbles and resulting ISI data may be further described below with regard to FIGS. 4 and 5.

At block 58, error event bubbles corresponding to the soft LLR values and representing ISI-MP in the SOVA detector may be passed to an ISI-MP block for use by the iterative decoder. For example, the SOVA detector may output ISI data for the detected symbols to an ISI-MP model in the local loop of the iterative decoder.

At block 60, the iterative decoder may execute one or more local iterations. For example, the iterative decoder may process an LDPC matrix based on the input soft LLR from the SOVA detector, determine that an additional local iteration is needed to meet the parity constraints for one or more symbols, and forward extrinsic soft LLR information to the ISI-MP block.

At block 62, the most recently used soft LLR values may be modified based on the ISI-MP model indicating a relevant error event bubble. For example, the extrinsic soft LLR information from the LDPC matrix may indicate an error event involving at least one symbol in an error event bubble and the ISI-MP block may use the ISI data corresponding to the error event bubble to modify the soft LLR values based on the second most likely symbol values in the error event bubble.

At block 64, the iterative decoder may periodically execute one or more global iterations. For example, the LDPC processing logic may selectively enable iterations back through the SOVA detector, providing extrinsic information for refreshing the soft LLR information and the ISI data based on the original input signal values.

At block 66, the iterative decoder may output decoded bit values responsive to the parity constraints being met. For example, after some number of local and/or global iterations, the parity constraints of the set of symbols being decoded may be satisfied and the iterative decode may output the decoded data bits for further processing by the read channel and/or data storage device.

Figure 3:
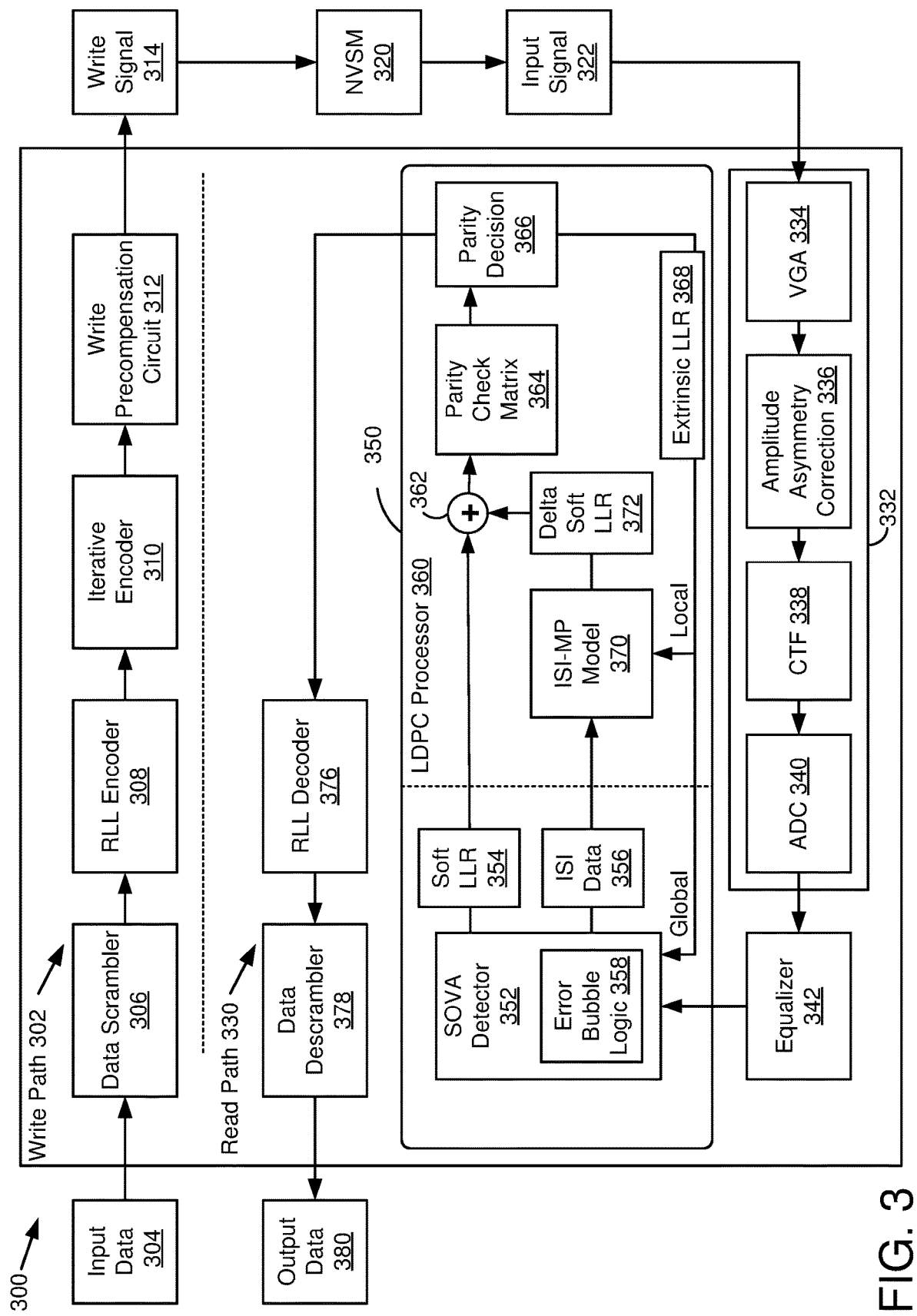
FIG. 3 is a block diagram of an example data storage system including various data processing components.

FIG. 3 is a block diagram illustrating control circuitry 300 comprising components employed in a read/write path of a storage system, such as the read/write channel of a data storage device. As illustrated, the write path 302 includes a data scrambler 306, an RLL encoder 308, an iterative encoder 310, and a write precompensation circuit 312. A write signal 314 may be output by the write path in some examples to store the resulting write bit stream to NVSM 320. Similarly, an input signal 322 may be read from NVSM 320 for processing through a read path 330. Read path 330 includes a variable gain amplifier (VGA) 334, an amplitude asymmetry correction (AAC) component 336, a continuous time filter (CTF) 338, an ADC 340, an equalizer 342, an iterative decoder 350, a RLL decoder 376, and a data descrambler 378. These component(s) receive input signals 322 as an analog read signal, and process, decode, and output the signals as output data 380, which may include decoded binary data units, such as data blocks. In some examples, these component(s) of read path 330 may comprise a read channel device or circuit.

Data scrambler 306 "randomizes" input data 304 ("whitens" the input sequence of the data) to be written into a storage media. In general, a storage system has no control over the data the user is going to write. This causes problems because it violates the assumptions that are usually made when designing storage systems, such as having independent data symbols. Since the data are not random, a frequently occurring problem is long strings of zeros in the data, which can cause difficulties in later timing recovery and adaptive equalization. These problematic sequences can be removed (or, actually, made much less likely) by introducing randomization of the input sequence for the input data 304. Therefore, during the data writing process, input data 304 may be first randomized by data scrambler 306.

RLL encoder 308 modulates the length of stretches in the randomized data. RLL encoder 308 employs a line coding technique that processes arbitrary data with bandwidth limits. Specifically, RLL encoder 308 can bound the length of stretches of repeated bits so that the stretches are not too long or too short. By modulating the data, RLL encoder 308 can reduce the timing uncertainty in later decoding of the stored data, which could lead to the possible erroneous insertion of bits when reading the data back, and thus ensure the boundaries between bits can more reliably be found.

Iterative encoder 310 can append one or more parity bits to the modulated block code for later detection whether certain errors occur during data reading process. For instance, an additional binary bit (a parity bit) may be added to a string of binary bits that are moved together to ensure that the total number of "1"s in the string is even or odd. The parity bits may thus exist in two different types, an even parity in which a parity bit value is set to make the total number of "1"s in the string of bits (including the parity bit) to be an even number, and an odd parity in which a parity bit is set to make the total number of "1"s in the string of bits (including the parity bit) to be an odd number. In some examples, iterative encoder 310 may implement a linear error correcting code, such as LDPC codes or other turbo codes, to generate codewords that may be written to and more reliably recovered from NVSM 320. In some examples, iterative encoder 310 may further implement one or more single parity check codes within the codeword for recovery using soft information decoding, such as SOVA, Bahl, Cocke, Jelinek, Raviv (BCJR), or other single parity check code decoding techniques. Iterative encoder 310 may implement iterative encoding techniques to reuse the decoder architecture (components of iterative decoder 350), thereby reducing circuit space.

Write precompensation circuit 312 can alleviate the effect of nonlinearities in the writing process. Major causes of the nonlinearities during data writing include bandwidth limitations in the write path and the demagnetizing fields in the magnetic medium for magnetic disks. These nonlinearities can cause data pattern-dependent displacements of recorded transitions relative to their nominal positions. The write precompensation circuit 312 can compensate for these data pattern-dependent displacements by introducing data pattern-dependent compensating shifts into the signals. After compensation, the information may then be written as non-return to zero (NRZ) data.

In an HDD embodiment, when reading data back from the NVSM 320, the data head of the disk drive senses the transitions (changes) in the storage medium and converts the information back into an electronic waveform. Reading analog input signal 322 from a storage medium starts at the storage medium (e.g., the drive's storage platter) and head transducer (see FIG. 2). The head transducer is located prior to the analog front-end circuit 332 in the data read path and the head transducer output is driven by the data pattern previously written on the rotating disk. After converting into an electronic waveform, the head transducer output (e.g., input signal 322) may be further processed by the components illustrated in FIG. 3 in the read path 330 for data detection, decoding, and descrambling.

VGA 334 amplifies the analog signal read back from the storage medium. VGA 334 controls a signal level of the read-back analog signal based on a gain determined by an automatic gain control loop. One main function of the automatic gain control loop is to control an input signal level for optimum performance in the ADC 340. Too much gain from VGA 334 can cause sample values in ADC 340 to rail at maximum or minimum ADC levels, while too little gain can cause quantization noise to dominate the signal-to-noise ratio (SNR) and thus adversely affect bit error rate performance.

AAC 336 and CTF 338 work to linearize the amplified analog signal prior to feeding it to ADC 340. In an HDD embodiment, AAC 336 works to reconstruct linearity that may have been lost in the head transducer stage when the information on the storage disk is converted into an electronic signal at the output of the data head. The biasing of the head signal may in some cases be adjusted to keep the signal in the linear range of the head sensitivity curve. However, if the signal amplitude changes due to fly height or disk variation exceed the head transducer linear range, saturation in the peak or trough of the electrical head signal can occur. AAC 336 may use signal offset to determine the amount of squared signal to add back to restore the positive and negative symmetry of the signal.

It should be noted that in practice, the read back analog signals from many different commonly used heads in existing devices cannot be linearized, regardless of the kind of biasing approach that is employed. Thus, improving data detection and recovery technology in the read channel can advantageously handle the read back signals from these types of heads because it may better compensate for non-linear responses from the read heads.

CTF 338 provides mid-band peaking to help attenuate high-frequency noise and minimize any aliasing that may occur when the analog signal is converted to a sampled representation. In an HDD embodiment, aliasing may not have a large effect on a drive surface's bit error rate performance. However, it can have an impact on disk drive manufacturing yields. CTF 338 is typically a multiple pole low pass filter (e.g., a four pole Butterworth filter) with a zero available for mid-band peaking. Signal peaking can be used to emphasize frequency components, which are useful in shaping the signal to meet the digital target signal characteristic. Besides anti-aliasing, CTF 338 may also partially equalize the data.

ADC 340 can convert an analog signal (e.g., input signal 322), as input and/or processed by upstream components, to digital samples quantized in time and amplitude. The clock used may include the output of a digital phase-locked loop, which tracks the channel rate clock frequency. The output of ADC 340 may be used as feedback to control the timing of the digital phase-locked loop as well as the automatic gain control, direct current (DC) baseline correction, and equalization. VGA 334, CTF 338, and ADC 340, with or without AAC 336, together may be called an analog front-end 332, as the signals processed in these components are analog, while the signals in the remaining downstream components of read path 330 may be digital, although other variations of analog front-end 332 (which may be considered as one example form of an analog to digital convertor) may comprise software and/or hardware elements configured to convert signals from analog to digital and/or include other components for filtering, tuning, and/or processing data. In an HDD embodiment, the read channel analog front-end functions are generally similar regardless of whether the data is recorded using perpendicular or horizontal techniques.

Equalizer 342 is used for compensating for channel distortion. For example, an FIR filter may perform filtering to provide additional equalization of the signal to match signal characteristic to the desired target response for bit detection. Some equalizers may also include a noise whitening filter that further equalizes the spectrum of the signal from the FIR samples to remove noise that has a non-flat amplitude spectrum. For example, the noise whitening filter may enhance low-level spectral components and attenuate high-level ones. At the output of equalizer 342, the signal is now in a fully digital form and ready for detection of the encoded bits. The digital sample stream is submitted as an input signal to the sequence detector (e.g., iterative decoder 350) to begin decoding in trellises for bit recovery.

Iterative decoder 350 may include an iterative inner decoder, such as an LDPC processor, and one or more SOVA detectors (sometimes considered a SOVA detector with multiple stages), such as SOVA detector 352. In the example shown, SOVA detector 352 receives the digital input signal from analog front-end 332 through equalizer 342. In some configurations, SOVA detector 352 may include a front-end SOVA stage configured to handle a first pass (N=1) bit detection and an iterative SOVA stage configured to handle each additional pass (N>1) for the same sample, symbol, or codeword. SOVA detector 352 may output detected bits (sampled in bits, symbols, or codewords) and corresponding soft information, such as soft LLR values 354, for each detected bit or symbol. In some embodiments, soft LLR 354 may include an LLR vector of values corresponding to the sequence of adjacent bits in a symbol being processed. Each element of the vector represents the relative cost associated with the symbol taking on that element value. Soft LLR values indicate the most likely state of their corresponding bit and may be considered both an indicator of bit value and probabilistic soft information regarding that bit value. SOVA detector 352 may output the bit detection data and corresponding soft information to LDPC processor 360 for iterative decoding based on the soft LLR values.

SOVA detector 352 may be further configured to output ISI data 356 describing the ISI-MP determined by SOVA detector 352 during the processing of the trellis of possible bit states. In prior configurations, such ISI data may have been available only within the SOVA detector and not externalized for use by other components, such as LDPC processor 360. As further described below, SOVA detector 352 may include event bubble logic 358 configured to use multiple paths (two or more) and corresponding sets of most likely symbols to determine possible error event bubbles, where two or more adjacent bit errors result in ISI. For example, SOVA detector 352 may determine the first most likely set of symbol values and the second most likely set of symbol values at each time step, then event bubble logic 358 may use those two sets of symbol values (and their corresponding minimal element costs) to determine whether an error in one symbol impacts one or more adjacent symbols (by determining error event lengths for each error bubble). ISI data 356 may correspond to indicators for each path that describe the ISI between adjacent symbols in the data stream, such as plotting the respective branch paths in a matrix for each transition between symbol indices where ISI may occur.

Event bubble logic 358 may be configured to determine the most likely error event bubble of which each symbol is a part and defines the ISI-MP connections each symbol has to its adjacent symbols. The first most likely path through the SOVA trellis may generate soft LLR 354. At every stage or time step through the trellis, there is a second lowest cost path (and, perhaps, third or higher lower cost paths) which represents the second most likely set of symbol values (and, similarly, alternative sets of symbol values for third or higher paths). The second lowest cost path occurs in segments which each diverge and reconverge with the first lowest cost path over various lengths (numbers of symbols or steps) of symbols. The enclosed area where the first and second lowest cost paths diverge and then reconverge may be called an error event bubble. When the first most likely set of symbols is found to be in error, the second most likely set of symbols is very probably, but not guaranteed, to be the correct sequence. The difference in costs between the first set of symbols and the second set of symbols may be referred to as SOVA margin and may be used to compute mutual information and/or generate other quality metrics.

Event bubble logic 358 may be configured to determine which symbols belong to the same error event bubble (also determining the event bubble length). Each symbol exists in an error event bubble that may be one or more symbols in length. Single symbol error event bubbles may not generate significant ISI and error event bubbles of two or greater length may be more relevant for generating ISI data 356. In some configurations, event bubble logic 358 may use reciprocity checking to determine which symbols belong to the same event bubble. For example, a two-step checking method may be used. The first and second minimal element costs may be determined per symbol index—the minimal element cost for each symbol in the first most likely path and for each symbol in the second most likely path. Then, a reciprocity check is made between each set of adjacent symbols in each path to ensure that the states mutually agree with the sequence flow. Event bubble logic 358 may determine an event bubble length corresponding to the number of consecutive symbols in dependent error states. A 1-length error event bubble may indicate that either a 1-symbol type of error has occurred or was closest to occurring and does not have significant ISI with adjacent symbols. A 2-length error event bubble may indicate that two consecutive symbols are in error or were closest to being in error and will have ISI between them. A 3-length error event bubble may indicate that three consecutive symbols are in error or were closest to being in error and will have ISI between each symbol. This may be extrapolated to any error event bubble length. ISI data 356 may include information for each symbol index and/or connection between symbol indices, regardless of the length of the error event bubble.

Figure 4:
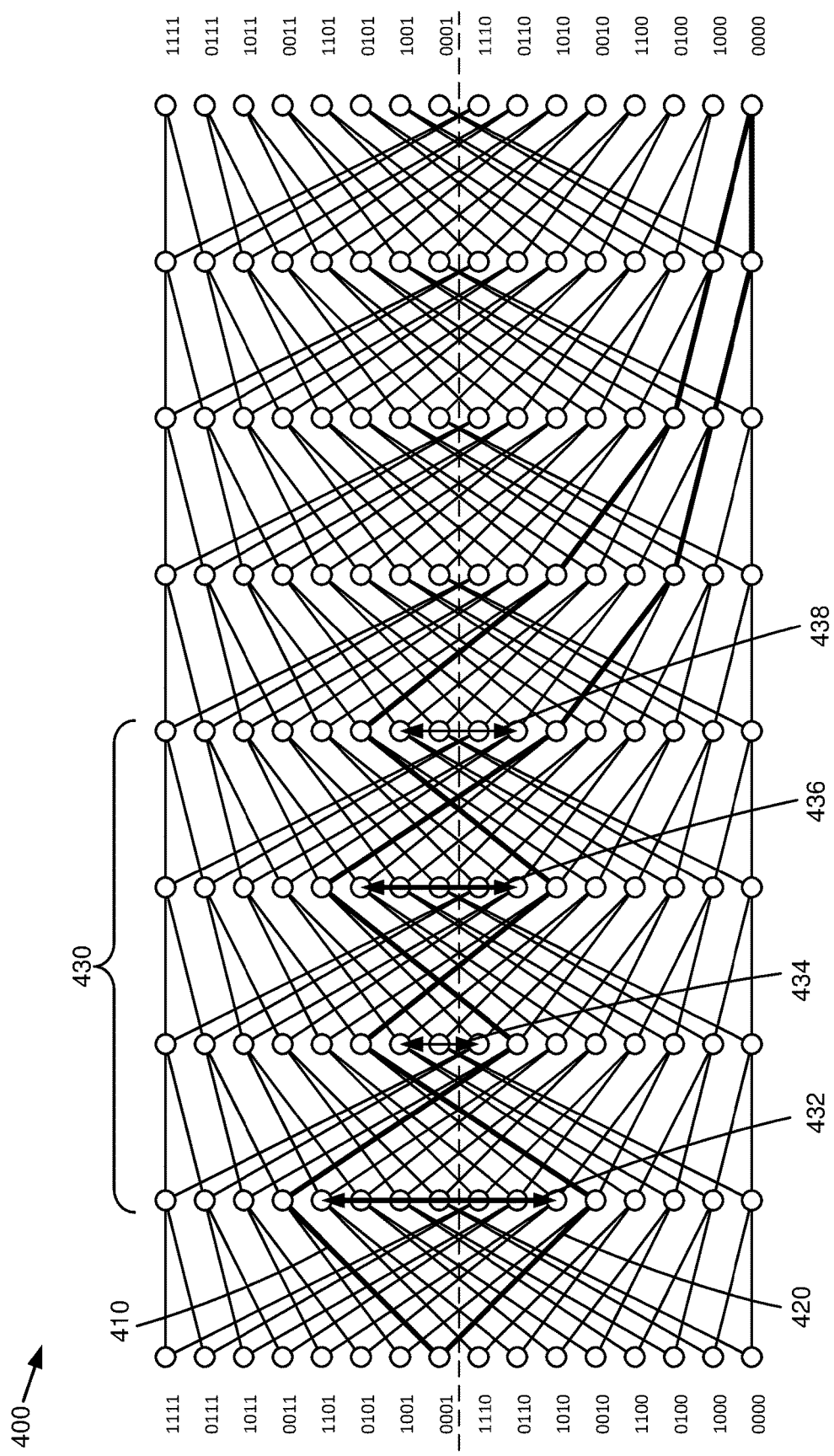
FIG. 4 is a diagram showing an example error event bubble in a sixteen state SOVA trellis.

SOVA detector 352 may use a Viterbi-like algorithm to decode a bit stream for bit recovery. SOVA detector 352 may include a variant of the classical Viterbi algorithm. It may differ from the classical Viterbi algorithm in that it uses a modified path metric which takes into account a priori probabilities of the input symbols, and produces a soft output indicating the reliability of the decision. SOVA detector 352 may operate by constructing a trellis of state probabilities and branch metrics. For example, FIG. 4 shows a 16-state SOVA trellis (for 4-bit symbols) over nine symbol indices. In some examples, SOVA detector 352 may be configured to detect the probabilities of bit values based on single parity check codes. Once the bit recovery is completed, parity post-processing can be performed. In some examples, an initial set of bit probabilities (soft LLR values 354) may be provided to LDPC processor 360 for parity-based decoding of the codeword, initiating iterative bit detection by SOVA detector 352 and parity determination by LDPC processor 360 with the two components exchanging sets of bit probabilities as extrinsic information for reaching their maximum likelihood results and returning a decoding decision. Each time soft information is passed from SOVA detector 352 to LDPC processor 360 and back to SOVA detector 352 may be considered a global iteration of iterative decoder 350. In some configurations, SOVA detector 352 and/or LDPC processor 360 may also perform internal iterations where data is not passed between them, referred to as local iterations. As described above, decoding of a symbol may involve a greater number of local iterations of LDPC processor 360 than global iterations returning extrinsic LLR 368 to SOVA detector 352. For example, LDPC processor 360 may execute multiple local iterations for each global iteration, sometimes as many as 4-10 times more.

LDPC processor 360 may help to ensure that the states at the parity block boundary satisfy the parity constraint by conducting parity error checking to determine whether data has been lost or written over during data read/write processes. It may check the parity bits appended by iterative encoder 310 during the data writing process, and compare them with the bits recovered by the SOVA detector. Based on the settings of iterative encoder 310 in the data writing process, each string of recovered bits may be checked to see if the "1"s total to an even or odd number for the even parity or odd parity, respectively. A parity-based post processor may also be employed to correct a specified number of the most likely error events at the output of the Viterbi-like detectors by exploiting the parity information in the coming sequence. SOVA detector 352 and LDPC processor 360 together may be referred to as an iterative decoder 350, as iterative decoding may exist between the two components. For example, SOVA detector 352 may pass detected sets of bit probabilities (e.g., soft LLR 354) to LDPC processor 360. LDPC processor 360 may use those bit probabilities to determine a most likely codeword match through parity check matrix 364. Syndromes from parity check matrix 364 may be used for parity decision 366, as well as determining extrinsic soft information, such as extrinsic LLR values 368, for subsequent iterations. If decode decision parameters, such as parity constraints of the original encoding, are not met, LDPC processor 360 may feedback extrinsic soft information for the set of bit probabilities to SOVA detector 352 as extrinsic soft information for further a next global iteration and SOVA detector 352 may feed forward a new set of bit probabilities (soft LLR values 354) for each global iteration to LDPC processor 360. When decode decision parameters are met, the codeword may be decoded into a set of decoded bit values for output or further processing by RLL decoder 376 and data descrambler 378.

LDPC processor 360 may be further configured to use ISI data 356 from SOVA detector 352 to assist iterative modifications of soft LLR values 354 within local iterations of LDPC processor 360. For example, extrinsic LLR values 368 generated from the syndromes of parity check matrix 364 may be passed to ISI-MP model 270 to generate delta soft LLR values 372 that modify soft LLR values 354 at summation 362 during local iterations. ISI-MP model 370 may be embodied in a logical block and/or firmware the uses ISI data 356 and extrinsic LLR 368 to determine error events present in soft LLR 354 and calculate delts soft LLR 372 to correct the symbols in the error event bubble by modeling the ISI-MP represented in ISI data 356. For example, extrinsic LLR values may identify possible detection errors in one or more symbols corresponding to an error event bubble and ISI-MP model 270 may determine delta LLR values that change the LLR values and most likely symbol states of each symbol in the error event bubble, enabling LDPC processor 360 to use the modified LLR values on the next iteration through parity check matrix 364. ISI-MP model 270 may use ISI data describing the error event bubbles and corresponding ISI relationships to implement ISI message passing at very low complexity, allowing its use in each local iteration of LDPC processor 360. ISI-MP model 370 may be inserted into the local iteration path of the inner iterative decoder, such as LDPC processor 360, through direct integration into the hardware and/or firmware logic of the inner iterative decoder and/or provided as a separate block in communication with the inner iterative decoder. ISI-MP model 370 may include memory configured to store ISI data 356 from SOVA detector 352 during iterative local processing by LDPC processor 360. The same set of ISI data may be used for a plurality of local iterations and be replaced responsive to the next global iteration generating new ISI data from SOVA detector 352. ISI-MP model 370 may be configured to imitate the operation of SOVA detector 352 during local iterations by providing a piecewise model of the message passing between adjacent symbols, such ash the ISI among symbols in the same error event bubble.

In some embodiments, ISI data 356 may include error event bubbles defined in terms of more than one alternate path, such as the first most likely, second most likely, and third most likely sets of symbol values. For example, SOVA detector 352 may determine second and third most likely paths through the trellis and error bubble logic 358 may determine their respective error event bubbles. ISI-MP model 370 may be configured to use both secondary and tertiary symbol likelihoods and alternative error event bubbles for iterative determination of error events and possible soft LLR changes to overcome those errors. Use of more than two sets of symbols, likelihoods, and corresponding error event bubbles may be limited to larger symbol lengths and corresponding trellis sizes.

RLL decoder 376 may decode the run length limited codes encoded by the RLL encoder 308 during the data writing process, and the data descrambler 378 may descramble the resulting sequence, which eventually can reveal the original user data written into the storage media. The recovered or read data, output data 380, may then be sent to a requesting device, such as a host computer, network node, etc., in response to receiving the request for the data. In some configurations, decoded bit data from read path 330 may undergo further processing in the data storage device, such as at the controller firmware level, before being returned to the requesting device.

FIG. 4 shows a 16-state SOVA trellis 400 for a 4-bit symbol through 9 stages or adjacent symbol indices. Bit detection path 410 may represent the first most likely path through trellis 400 and bit detection path 420 may represent the second most likely path through trellis 400, based on their respective likelihood values (costs relative to other paths at each symbol index). A comparison of bit detection path 410 and bit detection path 420 identifies an error event bubble 430 with an event bubble length of 4 symbols for a potential +−+− error event. As shown, the error event bubble length and length of a corresponding error event is four adjacent symbols. Each symbol index includes a symbol value for bit detection path 410 and a symbol value for bit detection path 420. The distance between those symbols in the trellis may indicate the margin of the error. For example, margin 432 may represent the difference between the symbol value for bit detection path 410 and the symbol for bit detection path 420 at the second symbol index in the trellis, margin 434 may represent the difference between the symbol value for bit detection path 410 and the symbol for bit detection path 420 at the third symbol index in the trellis, margin 436 may represent the difference between the symbol value for bit detection path 410 and the symbol for bit detection path 420 at the fourth symbol index in the trellis, and margin 438 may represent the difference between the symbol value for bit detection path 410 and the symbol for bit detection path 420 at the fifth symbol index in the trellis.

As discussed above, the SOVA detector may compare each corresponding symbol at the same symbol index to determine whether a possible error state exists and then compare symbols at adjacent symbol indices to determine which errors may be grouped in an error event bubble.

Figure 5:
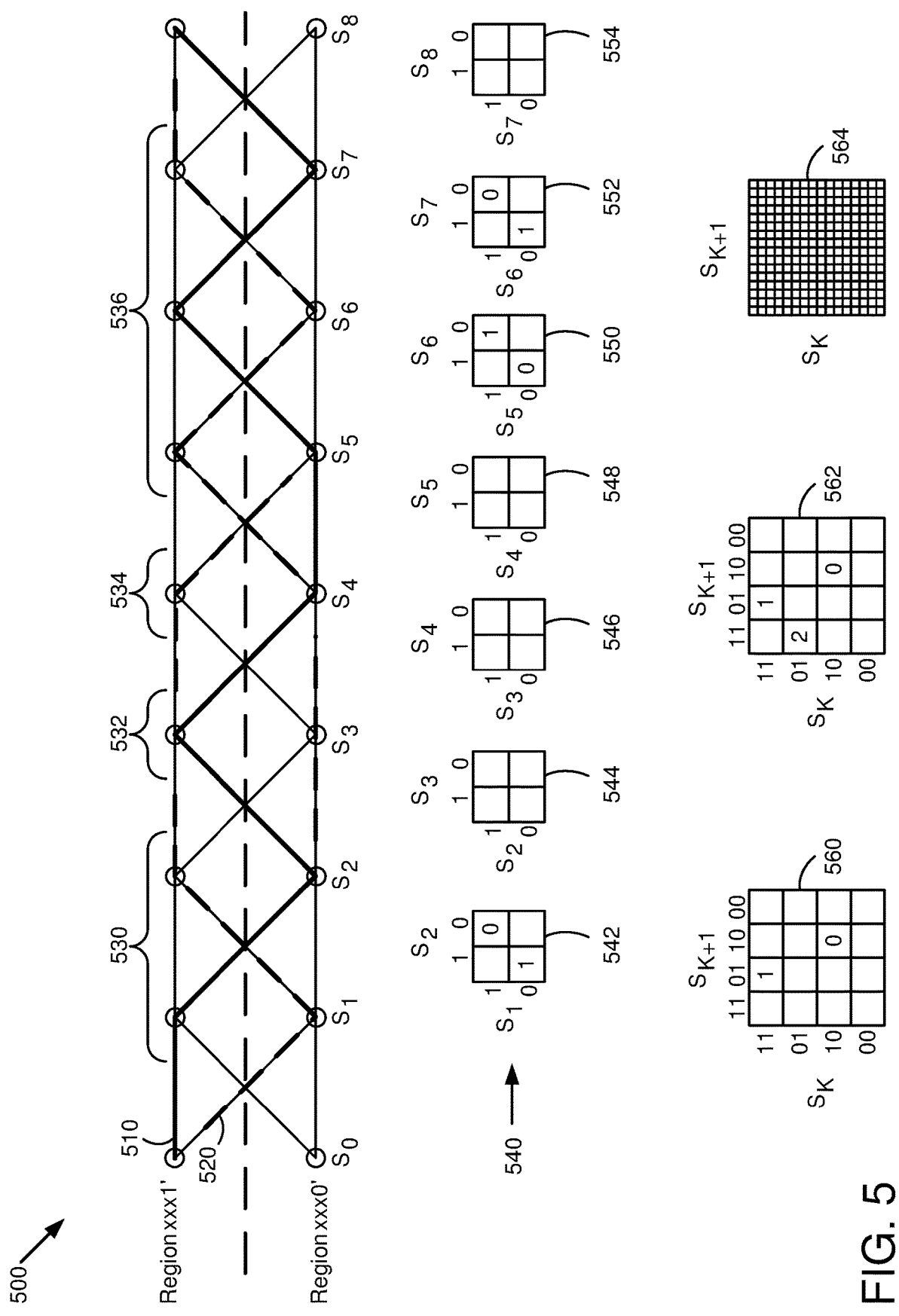
FIG. 5 is a diagram showing a binary example error event bubbles and extrinsic inter-symbol interference data sharing.

FIG. 5 shows a binary SOVA trellis 500 for illustrating error event bubbles and an example format for extrinsically sharing ISI data between the SOVA detector and other components, such as the LDPC processor or ISI-MP block. Trellis 500 shows nine adjacent symbol indices $S_0$ to $S_8$ and two bit detection paths 510 and 520. For example, bit detection path 510 may correspond to the first most likely path and bit detection 520 may correspond to the second most likely path. Trellis 500 depicts four separate error event bubbles 530, 532, 534, and 536. Error event bubble 530 has an error event bubble length of two and represents adjacent flipped bits with reciprocity between the respective $S_1$ and $S_2$ decisions. ISI may occur between $S_1$ and $S_2$ as a result. Error event bubbles 532 and 534 each have an error event bubble length of one and represent adjacent symbols that do not share reciprocity and, therefore, are separate error event bubbles. Error event bubble 536 has an error event length of three and represents three adjacent flipped bits with reciprocity between adjacent decisions. ISI may occur between $S_5$ to $S_6$ and $S_6$ to $S_7$.

An example of corresponding ISI data 540 is shown below trellis 500. In this example, ISI data 540 is conveyed as ISI connection matrices representing the connections of the two paths between adjacent symbol indices. Each connection matrix may include a first indicator for first detection path 510 and a second indicator for second detection path 520 between the symbols represented by that matrix. For example, connection matrix 542 represents the connections between $S_1$ and $S_2$, has a first indicator "0" indicating that the connection followed by the first connection path is from the 1 value at $S_1$ to the 0 value at $S_2$, and has a second indicator "1" indicating that the connection followed by the second connection path is from the 0 value at $S_1$ to the 1 value at $S_2$. This information allows an ISI-MP model receiving it to simulate ISI message passing for subsequent iterative decoder iterations without recalculating SOVA trellis 500. Connection matrices for connections to or from single error bubbles, such as connection matrices 544, 546, and 548, and/or adjacent symbol indices where the paths agree, such as connection matrix 554, may not include any connection indicators because they do not generate relevant ISI. This extrinsic information may still be useful to the ISI-MP model for determining alternate paths and resulting delta LLR values. Error event bubbles longer than two adjacent symbols may result in N−1 (where N is the error event bubble length) adjacent connection matrices representing the ISI. For example, error event bubble 536 has a length of three symbols and the resulting ISI is represented by connection matrices 550 and 552. A series of sequential matrices (e.g., 542-554) between each step may represent the ISI data for both paths through the SOVA trellis 500 and may convey that ISI data to other components, such as an ISI-MP block.

For simplicity, example SOVA trellis 500 is a binary trellis, but the same methods apply regardless of symbol and trellis size. Increasing symbol size and number of possible symbol states increases the size of the connection matrices used to communicate ISI data. For example, connection matrix 560 provides ISI data for two-bit symbols with four possible states at the adjacent symbol indices. Additionally, connection matrices may support additional indicators for more than two detection paths. For example, in connection matrix 562 a third indicator "2" is added for the ISI information for a third detection path. Connection matrices may be extended to support any symbol and trellis size. For example, the 4-bit symbol trellis 400 shown in FIG. 4 may be represented in ISI data using a 16×16 connection matrix 564. Connection matrices and indicator values may be embodied in a number of hardware register, signal, and/or data configurations for locating the two or more indicators within the matrix and associating those matrix positions with starting and ending symbol values for the connection path.

Figure 6:
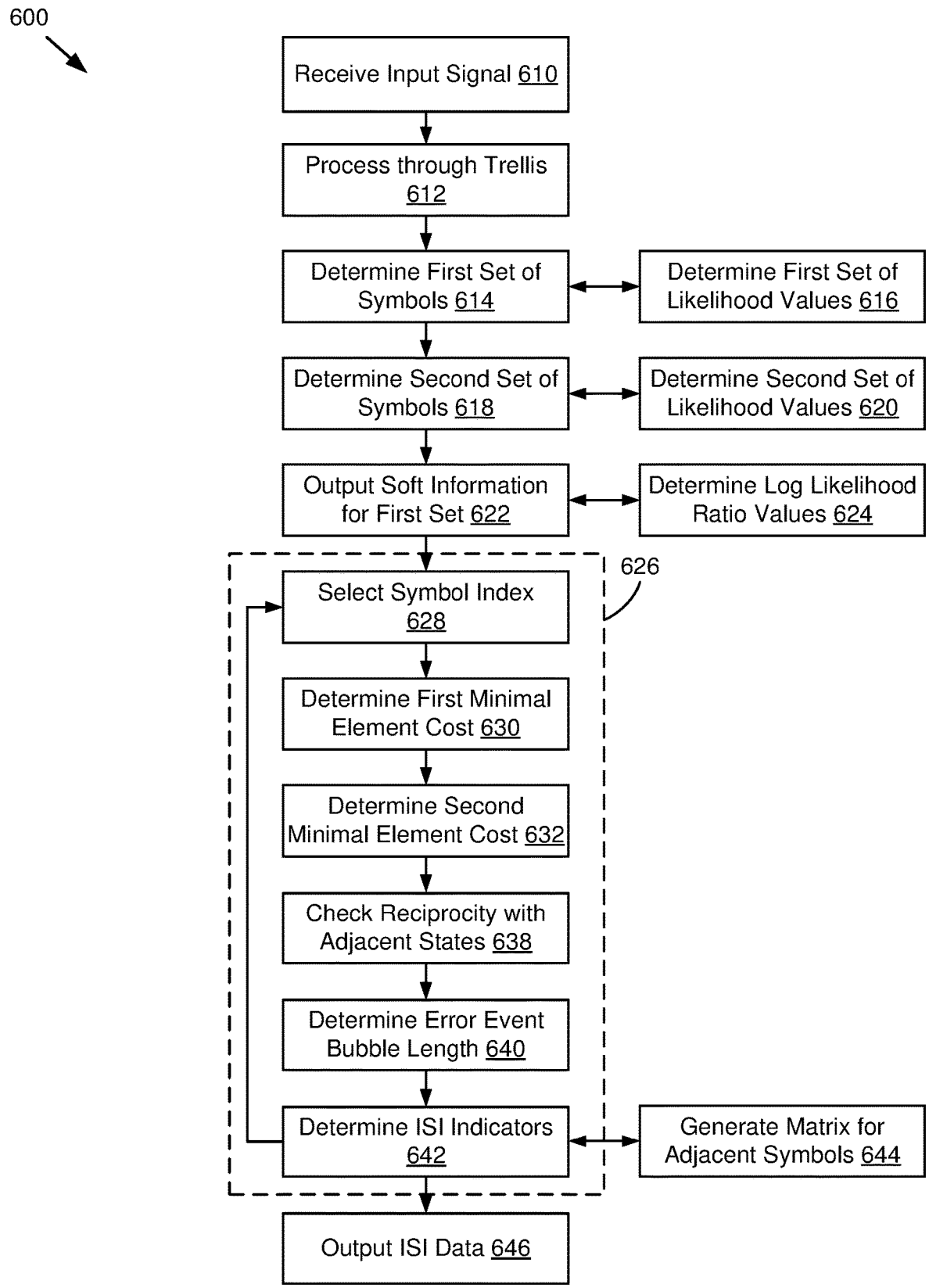
FIG. 6 is an example method of generating inter-symbol interference data.

As shown in FIG. 6, control circuitry 300 may be operated according to an example method of generating ISI data from a SOVA detector in the channel, i.e., according to the method 600 illustrated by blocks 610-646.

At block 610, an input signal may be received by a read channel. For example, a SOVA detector may receive a digital read signal from an analog front-end of the read channel.

At block 612, the input signal may be processed through a SOVA trellis. For example, the SOVA detector may use a Viterbi-like algorithm and corresponding trellis structure to determine the likelihood of each symbol value at each signal index for a digital sample from the input signal.

At block 614, a first set of symbols may be determined for the most likely path through the trellis. For example, the SOVA detector may select the highest likelihood value for each signal index as the most likely path. At block 616, a first set of likelihood values may be determined for the most likely path. For example, the SOVA detector may calculate a likelihood value for each symbol along the most likely path based on the minimal element costs of each symbol and connection in order to determine the first set of symbols.

At block 618, a second set of symbols may be determined for the second most likely path through the trellis. For example, the SOVA detector may select the second highest likelihood value for each signal index as the most likely path. In some configurations, there may be a minimum likelihood threshold to select a second highest likelihood that, if not met, may cause the SOVA detector to include the same symbol for the same symbol index in both the first and second most likely paths. At block 620, a second set of likelihood values may be determined for the second most likely path. For example, the SOVA detector may calculate a likelihood value for each symbol along the second most likely path based on the minimal element costs of each symbol and connection in order to determine the second set of symbols.

At block 622, soft information for the first set of symbols may be output. For example, the SOVA detector may output soft information including soft LLR values for each symbol in the first set of symbols to an inner iterative decoder, such as an LDPC processor. At block 624, the SOVA detector may determine the log likelihood ratio (LLR) values from the respective cost values of the symbols in the first set compared to the remaining symbols for that symbol index to be output at block 622.

Block 626 includes example blocks for determining error event bubbles and corresponding ISI data for both the first set of symbols and the second set of symbols. At block 628, a symbol index may be selected. For example, the SOVA detector may select a symbol index for comparison.

At block 630, a first minimal element cost may be determined for the symbol from the first set of symbols at the selected symbol index. For example, the SOVA detector may determine the minimal element cost for the symbol in the most likely path based on the trellis.

At block 632, a second minimal element cost may be determined for the symbol from the second set of symbols at the selected symbol index. For example, the SOVA detector may determine the minimal element cost for the symbol in the second most likely path based on the trellis.

At block 638, reciprocity may be checked between adjacent symbols. For example, the SOVA detector may check reciprocity between the symbol states of the selected symbol index and one or both adjacent symbol states for the same detection path. Reciprocity may be checked within the symbols in the same set, such as first checking reciprocity for adjacent symbols along the most likely path and then checking reciprocity for adjacent symbols along the second most likely path. Failure of reciprocity may indicate that the adjacent symbols are not part of the same error event bubble.

At block 640, error event bubble length may be determined. For example, the SOVA detector may determine the number of adjacent symbols meeting both minimal element cost thresholds and reciprocity conditions.

At block 642, ISI indicators may be determined. For example, the SOVA detector may generate ISI indicators for each set of adjacent states in error event bubbles with a length greater than one, such as a first indicator for the connection in the first set of symbols and a second indicator for the connection in the second set of symbols. At block 644, a connection matrix may be generated for defining and communicating the ISI indicators. For example, the SOVA detector may populate a connection matrix for each transition between symbol indices and selectively populate them with ISI indicators when error event bubble conditions for ISI are met.

At block 646, the ISI data may be output. For example, the SOVA detector may output ISI data as a series of connection matrices to an ISI-MP model and/or inner iterative decoder, such as an LDPC processor.

Figure 7:
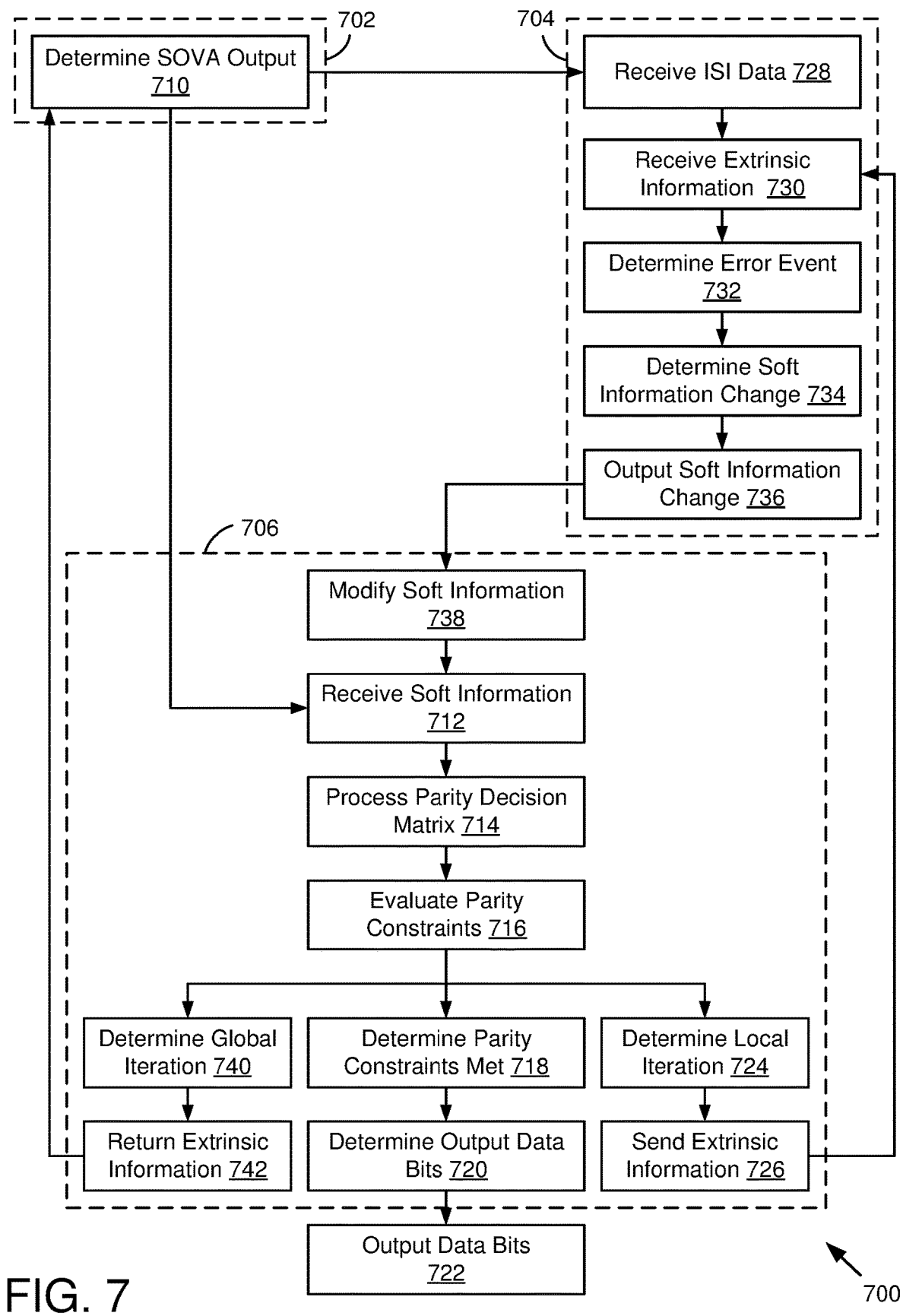
FIG. 7 is an example method of using inter-symbol interference data in iterative decoding.

As shown in FIG. 7, control circuitry 300 may be operated according to an example method of using ISI data for local iterations of an inner iterative decoder, i.e., according to the method 700 illustrated by blocks 710-742. For example, block 702 may include block 710 executable by a SOVA detector, block 704 may include blocks 728-736 executable by an ISI-MP circuit, and block 706 may include blocks executable by an LDPC processor (which may include the ISI-MP circuit).

At block 710, the output of a SOVA detector may be determined. For example, the SOVA detector may use the method of FIG. 6 to determine soft information and ISI data for a series of symbols in an input signal.

At block 712, soft information may be received by an iterative decoder. For example, an LDPC processor may receive soft LLR values for the most likely series of symbols in the input signal.

At block 714, the soft information may be processed through a parity decision matrix. For example, the LDPC processor may process the soft LLR values through an H-matrix to generate syndrome information based on the parity encoding used to encode the data.

At block 716, parity constraints may be evaluated. For example, the LDPC process may evaluate the syndromes from the parity decision matrix to determine whether symbols and the bits they contain sufficiently meet the defined parity constraints for returning output data (proceed to block 718), initiating a local iteration for further processing (proceed to block 724), or initiating a global iteration (proceed to block 740). Note that additional factors in addition to parity constraints, such as time, prior iterations, etc., may be considered in determining the next block and other outcomes, such as returning unreadable data errors, may also be possible.

At block 718, parity constraints may be determined to have been met for the series of symbols. For example, the LDPC processor may determine a set of syndromes that indicate that all data bits comply with the parity encoding. At block 720, the output data bits for series of symbols may be determined. For example, based on the symbol values that generated the error-free syndromes, the LDPC processor identifies the bit state of each place in each symbol. At block 722, the data bits may be output. For example, the LDPC processor may output the bit stream to another read channel element in the read path or to a buffer or register for further processing by the data storage device and/or return to the requesting device.

At block 724, a local iteration may be determined. For example, the LDPC processor may determine that not all syndromes are error free and additional processing is necessary. Based on timing, iteration counts, number of errors, and/or other criteria, the LDPC processor may select a local iteration and send, at block 726, extrinsic information based on the detected errors to the ISI-MP block for modifying the soft LLR values for the next local iteration.

At block 728, ISI data has been received. For example, the ISI-MP block may have previously received and stored the ISI data from the SOVA detector.

At block 730, extrinsic information may be received. For example, the ISI-MP block may receive extrinsic error data, such as extrinsic LLR data based on the LDPC matrix processing, for a local iteration of the LDPC processor.

At block 732, an error event may be identified. For example, the ISI-MP block may determine one or more errors corresponding to one or more error event bubbles from the extrinsic LLR data.

At block 734, soft information changes may be determined. For example, the ISI-MP block may use the ISI data related to one or more error event bubbles corresponding to the error events to determine which soft LLR values should be modified and by how much.

At block 736, the soft information change may be output. For example, the ISI-MP block may output the soft LLR change values to modify the soft LLR values received from the SOVA detector. In some embodiments, the ISI-MP block may receive and modify the soft information from the SOVA detector (effectively replicating block 712 and moving block 738 into the ISI-MP block).

At block 738, the soft information from the SOVA detector may be modified by the soft information change from the ISI-MP block. For example, the LDPC processor may combine the change values from the ISI-MP block with the soft LLR values from the SOVA detector. The LDPC processor may use the modified soft information in blocks 714 and 716 to complete a local iteration of the LDPC processor.

At block 740, a global iteration may be determined. For example, the LDPC processor may determine, based on timing, iteration counts, number of errors, and/or other criteria, that a global iteration should be initiated through the SOVA detector. At block 742, extrinsic information based on the detected errors may be returned to the SOVA detector. For example, the LDPC process may return extrinsic LLR values for use by the SOVA detector for a global iteration of the iterative decoder.

Technology for improved data detection and decoding in a read channel based on sharing ISI data from a soft output detector is described above. In the above description, for purposes of explanation, numerous specific details were set forth. It will be apparent, however, that the disclosed technologies can be practiced without any given subset of these specific details. In other instances, structures and devices are shown in block diagram form. For example, the disclosed technologies are described in some implementations above with reference to particular hardware.

Reference in the specification to "one embodiment" or "an embodiment" means that a particular feature, structure, or characteristic described in connection with the embodiment is included in at least one embodiment or implementation of the disclosed technologies. The appearances of the phrase "in one embodiment" in various places in the specification are not necessarily all referring to the same embodiment or implementation.

Some portions of the detailed descriptions above may be presented in terms of processes and symbolic representations of operations on data bits within a computer memory. A process can generally be considered a self-consistent sequence of operations leading to a result. The operations may involve physical manipulations of physical quantities. These quantities take the form of electrical or magnetic signals capable of being stored, transferred, combined, compared, and otherwise manipulated. These signals may be referred to as being in the form of bits, values, elements, symbols, characters, terms, numbers, or the like.

These and similar terms can be associated with the appropriate physical quantities and can be considered labels applied to these quantities. Unless specifically stated otherwise as apparent from the prior discussion, it is appreciated that throughout the description, discussions utilizing terms for example "processing" or "computing" or "calculating" or "determining" or "displaying" or the like, may refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The disclosed technologies may also relate to an apparatus for performing the operations herein. This apparatus may be specially constructed for the required purposes, or it may include a general-purpose computer selectively activated or reconfigured by a computer program stored in the computer. Such a computer program may be stored in a computer readable storage medium, for example, but is not limited to, any type of disk including floppy disks, optical disks, CD-ROMs, and magnetic disks, read-only memories (ROMs), random access memories (RAMs), erasable programmable read-only memories (EPROMs), electrically erasable programmable read-only memories (EEPROMs), magnetic or optical cards, flash memories including universal serial bus (USB) keys with non-volatile memory or any type of media suitable for storing electronic instructions, each coupled to a computer system bus.

The disclosed technologies can take the form of an entire hardware implementation, an entire software implementation or an implementation containing both hardware and software elements. In some implementations, the technology is implemented in software, which includes but is not limited to firmware, resident software, microcode, etc.

Furthermore, the disclosed technologies can take the form of a computer program product accessible from a non-transitory computer-usable or computer-readable medium providing program code for use by or in connection with a computer or any instruction execution system. For the purposes of this description, a computer-usable or computer-readable medium can be any apparatus that can contain, store, communicate, propagate, or transport the program for use by or in connection with the instruction execution system, apparatus, or device.

A computing system or data processing system suitable for storing and/or executing program code will include at least one processor (e.g., a hardware processor) coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output or I/O devices (including but not limited to keyboards, displays, pointing devices, etc.) can be coupled to the system either directly or through intervening I/O controllers.

Network adapters may also be coupled to the system to enable the data processing system to become coupled to other data processing systems or remote printers or storage devices through intervening private or public networks. Modems, cable modems, and Ethernet cards are just a few of the currently available types of network adapters.

The terms storage media, storage device, and data blocks are used interchangeably throughout the present disclosure to refer to the physical media upon which the data is stored.

Finally, the processes and displays presented herein may not be inherently related to any particular computer or other apparatus. Various general-purpose systems may be used with programs in accordance with the teachings herein, or it may prove convenient to construct more specialized apparatus to perform the required method operations. The required structure for a variety of these systems will appear from the description above. In addition, the disclosed technologies were not described with reference to any particular programming language. It will be appreciated that a variety of programming languages may be used to implement the teachings of the technologies as described herein.

The foregoing description of the implementations of the present techniques and technologies has been presented for the purposes of illustration and description. It is not intended to be exhaustive or to limit the present techniques and technologies to the precise form disclosed. Many modifications and variations are possible in light of the above teaching. It is intended that the scope of the present techniques and technologies be limited not by this detailed description. The present techniques and technologies may be implemented in other specific forms without departing from the spirit or essential characteristics thereof. Likewise, the particular naming and division of the modules, routines, features, attributes, methodologies and other aspects are not mandatory or significant, and the mechanisms that implement the present techniques and technologies or its features may have different names, divisions and/or formats. Furthermore, the modules, routines, features, attributes, methodologies and other aspects of the present technology can be implemented as software, hardware, firmware or any combination of the three. Also, wherever a component, an example of which is a module, is implemented as software, the component can be implemented as a standalone program, as part of a larger program, as a plurality of separate programs, as a statically or dynamically linked library, as a kernel loadable module, as a device driver, and/or in every and any other way known now or in the future in computer programming. Additionally, the present techniques and technologies are in no way limited to implementation in any specific programming language, or for any specific operating system or environment. Accordingly, the disclosure of the present techniques and technologies is intended to be illustrative, but not limiting.

What is claimed is:

1. A read channel circuit, comprising:
   a soft output detector configured to:
      receive an input signal comprising digital bit samples from an analog data signal;
      determine a first set of symbols with a first likelihood within a period of the input signal;
      determine a second set of symbols with a second likelihood within the period of the input signal;
      determine first inter-symbol interference data for adjacent symbols in the first set of symbols;
      determine second inter-symbol interference data for adjacent symbols in the second set of symbols;
      output soft information for the first set of symbols; and
      output the first inter-symbol interference data and the second inter-symbol interference data;
   an inter-symbol interference message passing model configured to:
      receive the first inter-symbol interference data and the second inter-symbol interference data from the soft output detector; and
      determine a change in the soft information for the first set of symbols based on:
         the first inter-symbol interference data;
         the second inter-symbol interference data; and
         at least one error event; and
      output the change in the soft information for the first set of symbols; and
   an iterative decoder configured to use the change in the soft information for iterative decoding of the input signal to output a decoded data unit based on the input signal.

2. The read channel circuit of claim 1, wherein:
   the soft output detector is further configured to:
      receive the input signal from an analog-to-digital converter; and
      output the soft information, the first inter-symbol interference data, and the second inter-symbol interference data for a global iteration through the soft output detector and the iterative decoder; and
   the iterative decoder is further configured to:
      use the change in the soft information for a local iteration through a parity check matrix of the iterative decoder; and
      output the decoded data unit responsive to a parity constraint being met.

3. The read channel circuit of claim 1, wherein the iterative decoder is further configured to:
   receive the soft information for the first set of symbols;
   determine output data bits for the decoded data unit based on:
      the soft information for the first set of symbols;
      parity encoding; and
      parity message passing;
   iteratively process the soft information for the first set of symbols until a parity constraint of the parity encoding is met;
   selectively output the output data bits;
   selectively return extrinsic soft information for the first set of symbols to the soft output detector for global iterations; and
   selectively send the extrinsic soft information for the first set of symbols to the inter-symbol interference message passing model for local iterations.

4. The read channel circuit of claim 3, wherein:
the inter-symbol interference message passing model is further configured to receive the extrinsic soft information for the first set of symbols for local iterations;
determining the change in the soft information for the first set of symbols is further based on the extrinsic soft information indicating at the at least one error event; and
outputting the change in the soft information of the first set of symbols modifies the soft information of the first set of symbols as an input for a next local iteration of the iterative decoder.

5. The read channel circuit of claim 1, wherein:
the first inter-symbol interference data and the second inter-symbol interference data includes at least one error event bubble;
the at least one error event bubble has a length corresponding to a number of adjacent symbols in a trellis of the soft output detector;
error events with a length greater than one symbol generate inter-symbol interference; and
the first inter-symbol interference data and the second inter-symbol interference data describe inter-symbol interference between adjacent symbols in the at least one error event bubble.

6. The read channel circuit of claim 5, wherein the soft output detector is further configured to:
determine a first minimal element cost per symbol index for the first set of symbols;
determine a second minimal element cost per symbol index for the second set of symbols; and
check reciprocity between adjacent states to determine adjacent symbols belonging to a same error event bubble.

7. The read channel circuit of claim 5, wherein the first inter-symbol interference data and the second inter-symbol interference data comprises:
a series of matrices corresponding to connections between adjacent symbols in the trellis of the soft output detector;
a first indicator in at least one matrix of the series of matrices corresponding to inter-symbol interference between adjacent symbols in the first set of symbols; and
a second indicator in the at least one matrix of the series of matrices corresponding to inter-symbol interference between adjacent symbols in the second set of symbols.

8. The read channel circuit of claim 7, wherein the first indicator and the second indicator are included in a plurality of sequential matrices in the series of matrices for error event bubbles with a length greater than two.

9. The read channel circuit of claim 1, wherein the soft output detector is further configured to:
determine a third set of symbols with a third likelihood within the period of the input signal;
determine third inter-symbol interference data for adjacent symbols in the third set of symbols; and
output the third inter-symbol interference data.

10. A data storage device comprising the read channel circuit of claim 1.

11. A method comprising:
receiving, by a soft output detector, an input signal comprising digital bit samples from an analog data signal;
determining, by the soft output detector, a first set of symbols with a first likelihood within a period of the input signal;
determining, by the soft output detector, a second set of symbols with a second likelihood within the period of the input signal;
determining first inter-symbol interference data for adjacent symbols in the first set of symbols;
determining second inter-symbol interference data for adjacent symbols in the second set of symbols;
outputting soft information for the first set of symbols;
outputting the first inter-symbol interference data and the second inter-symbol interference data;
receiving, by an inter-symbol interference message passing circuit, the first inter-symbol interference data and the second inter-symbol interference data from the soft output detector;
determining a change in the soft information for the first set of symbols based on: the first inter-symbol interference data; the second inter-symbol interference data; and at least one error event;
outputting, by the inter-symbol interference message passing circuit, the change in the soft information for the first set of symbols; and
using, by an iterative decoder, the change in the soft information for iterative decoding of the input signal to output a decoded data unit based on the input signal.

12. The method of claim 11, wherein:
outputting the soft information, the first inter-symbol interference data, and the second inter-symbol interference data from the soft output detector is for a global iteration through the soft output detector and the iterative decoder;
using the change in the soft information by the iterative decoder is for a local iteration through a parity check matrix of the iterative decoder; and
outputting the decoded data unit is responsive to a parity constraint being met.

13. The method of claim 11, further comprising:
receiving, by the iterative decoder, the soft information for the first set of symbols;
determining, by the iterative decoder, output data bits based on:
the soft information for the first set of symbols;
parity encoding; and
parity message passing;
iteratively processing, by the iterative decoder, the soft information for the first set of symbols until a parity constraint of the parity encoding is met;
selectively outputting, by the iterative decoder, the output data bits;
selectively returning, by the iterative decoder, extrinsic soft information for the first set of symbols to the soft output detector for global iterations; and
selectively sending, by the iterative decoder, the extrinsic soft information for the first set of symbols to the inter-symbol interference message passing circuit for local iterations.

14. The method of claim 13, wherein:
the inter-symbol interference message passing circuit is further configured to receive the extrinsic soft information for the first set of symbols for local iterations;
determining the change in the soft information for the first set of symbols is further based on the extrinsic soft information indicating the at least one error event; and
outputting the change in the soft information of the first set of symbols modifies the soft information of the first set of symbols as an input for a next local iteration of the iterative decoder.

15. The method of claim 11, wherein:
the first inter-symbol interference data and the second inter-symbol interference data includes at least one error event bubble;
the at least one error event bubble has a length corresponding to a number of adjacent symbols in a trellis of the soft output detector;
error events with a length greater than one symbol generate inter-symbol interference; and
the first inter-symbol interference data and the second inter-symbol interference data describe inter-symbol interference between adjacent symbols in the at least one error event bubble.

16. The method of claim 15, further comprising:
determining a first minimal element cost per symbol index for the first set of symbols;
determining a second minimal element cost per symbol index for the second set of symbols; and
checking reciprocity between adjacent states to determine adjacent symbols belonging to a same error event bubble.

17. The method of claim 15, wherein the first inter-symbol interference data and the second inter-symbol interference data comprises:
a series of matrices corresponding to connections between adjacent symbols in the trellis of the soft output detector;
a first indicator in at least one matrix of the series of matrices corresponding to inter-symbol interference between adjacent symbols in the first set of symbols; and
a second indicator in the at least one matrix of the series of matrices corresponding to inter-symbol interference between adjacent symbols in the second set of symbols.

18. The method of claim 17, wherein the first indicator and the second indicator are included in a plurality of sequential matrices in the series of matrices for error events with a length greater than two.

19. The method of claim 11, further comprising:
determining, by the soft output detector, a third set of symbols with a third likelihood within the period of the input signal; and
determining third inter-symbol interference data for adjacent symbols in the third set of symbols; and
outputting the third inter-symbol interference data.

20. A system comprising:
a soft output detector configured to:
    determine a first set of symbols with a first likelihood within a period of an input signal, wherein the input signal comprises digital bit samples from an analog data signal;
    determine a second set of symbols with a second likelihood within the period of the input signal;
    determine first inter-symbol interference data for adjacent symbols in the first set of symbols;
    determine second inter-symbol interference data for adjacent symbols in the second set of symbols;
    output soft information for the first set of symbols; and
    output the first inter-symbol interference data and the second inter-symbol interference data;
an inter-symbol interference message passing circuit configured to determine a change in the soft information based on at least one error event bubble, wherein:
    the first inter-symbol interference data and the second inter-symbol interference data includes the at least one error event bubble;
    the at least one error event bubble has a length corresponding to a number of adjacent symbols in a trellis of the soft output detector;
    error events with a length greater than one symbol generate inter-symbol interference; and
    the first inter-symbol interference data and the second inter-symbol interference data describe inter-symbol interference between adjacent symbols in the at least one error event bubble; and
an iterative decoder configured to:
    receive the change in soft information for an iteration of processing a parity decision matrix of the iterative decoder; and
    use the change in the soft information for iterative decoding of the first set of symbols to output a decoded data unit based on the input signal.

* * * * *